United States Patent [19]

Masuda et al.

[11] Patent Number: 5,073,872
[45] Date of Patent: Dec. 17, 1991

[54] DATA OUTPUT CONTROL CIRCUIT FOR SEMICONDUCTOR STORAGE DEVICE

[75] Inventors: Masami Masuda, Kawasaki; Kenichi Nakamura, Tokyo, both of Japan

[73] Assignee: Kabushiki Kaisha Toshiba, Kawasaki, Japan

[21] Appl. No.: 551,303

[22] Filed: Jul. 12, 1990

[30] Foreign Application Priority Data

Jul. 12, 1989 [JP] Japan .................................. 1-179814

[51] Int. Cl.⁵ .................... G11C 7/00; G11C 11/409
[52] U.S. Cl. .......................... 365/189.05; 365/203; 365/189.08; 365/233.5
[58] Field of Search .................. 365/189.05, 189.08, 365/203, 68, 189.01, 190, 233.5

[56] References Cited

U.S. PATENT DOCUMENTS 4,959,816 9/1990 Iwahashi et al. ............ 365/189.05 X
4,982,380 1/1991 Koike ........................ 365/189.05 X Primary Examiner—Alyssa H. Bowler
Attorney, Agent, or Firm—Foley & Lardner

[57] ABSTRACT

An equalizing transistor is connected between first and second data lines to which data corresponding to data stored in a memory cell selected by an address is outputted. When the equalizing pulse is applied to the control terminal of the equalizing transistor, the first and second data lines are made conductive with respect to each other so that the data lines are set at a predetermined equal potential. An output buffer switch has first and second output switches connected in series between a power source supply terminal and ground. An interconnection node between the output switches is a data output terminal. One or the other of the pair of data lines are connected to the control nodes of the first and second output switches. A data line switch is connected between the equalizing transistor and the output buffer switch of at least one of the pair of data lines. The data line switch is turned on and off by the equalizing pulse. A latch is connected between the data switch and the correspondingly connected ones of the output switch at said the lines. The latch latches the potentials at the data lines immediately before the turn-off of the data line switch and applies the latched potentials to the control terminals of the output switch.

15 Claims, 9 Drawing Sheets

DATA OUTPUT CONTROL CIRCUIT FOR SEMICONDUCTOR STORAGE DEVICE

FIELD OF THE INVENTION

The present invention relates to a data output control circuit for a semiconductor storage device, and more particularly to a data output control circuit for a semiconductor device suitable for use with a device executing so-called data equalizing by using clocks from an address transition detector (ATD).

BACKGROUND OF THE INVENTION

FIG. 1 is a circuit diagram of a data output control circuit for a semiconductor storage device incorporated herein to disclose the background art of this invention. As seen from FIG. 1, data are inputted to an output circuit section OC via data lines d and $\bar{d}$. The data are supplied to NOR gates G1 and G2. In order to access at high speed, it is necessary to equalize the data lines d and $\bar{d}$. This equalization is executed by applying a clock pulse $\Phi$ (ATD pulse) which is outputted when an ATD (address transition detector) detects a change of an address, to the gate of a transistor M3 coupling the data lines d and $\bar{d}$. The clock pulse $\bar{d}$ is also applied to the NOR gates G1 and G2 so as to prevent output from changing. The output nodes N4 and N5 of the NOR gates G1 and G2 are connected to the gates of output transistors M1 and M2, respectively. The output transistors M1 and M2 are connected in series. The output from the transistors M1 and M2 is derived from an output node (interconnection node) N1 thereof. A supply potential Vcc and ground potential Vss are supplied to the output circuit section OC from a d.c. power source E. A capacitor C2 is equivalently connected in parallel with the d.c. power source E. A reactor L2 and resistor R2 are equivalently connected at the supply potential Vcc side of the d.c. power source E, and a reactor L3 and resistor R3 are equivalently connected at the ground potential Vss side. Also in the power supply path of the output circuit section OC, a resistor R4 is equivalently connected at the supply potential Vcc side downstream of an input node N2, and a resistor R5 is equivalently connected at the ground potential Vss side downstream of an input node N3. Also at the output side of the output circuit section OC, there exists a serial circuit of a resistor R1, reactor L1, and capacitor C1.

The data output control circuit constructed as above will be described with reference to the timing chart shown in FIG. 2. FIG. 2(a) represents the state of the supply potential Vcc at the input node N2, FIG. 2(b) represents a change of an address, FIG. 2(c) represents the clock pulse $\Phi$, FIG. 2(d) represents the state of the data line d, FIG. 2(e) represents the state of the data line $\bar{d}$, FIG. 2(f) represents the state at the output node N4 of the NOR gate G1, FIG. 2(g) represents the state at the output node N5 of the NOR gate G2, FIG. 2(h) represents the state at the output node N1 of the output transistors M1 and M2, and FIG. 2(i) represents the state of the ground potential Vss at the input node N3.

As shown in FIG. 2(b), an address signal changes at time t1 (t6) so that there is obtained a clock pulse $\Phi_1$ which takes a high level from time t2 to time t3. As seen from FIG. 1, this clock pulse $\Phi_1$ is inputted to the gate of the transistor M3 to turn it on. Accordingly, the potentials of the data lines d and $\bar{d}$ take medium values during the period from time t2 to time t3 as shown in FIGS. 2(d) and 2(e). The clock pulse $\Phi$ is also applied to the NOR gates G1 and G2 so that the potentials at the output nodes N4 and N5 of the NOR gates G1 and G2 take a low level during the period from time t2 to time t3 as shown in FIGS. 2(f) and 2(g). The outputs of the NOR gates G1 and G2 are inputted to the gates of the output transistors M1 and M2. A data having an output waveform as shown in FIG. 1(h) is obtained at the output node N1 of the output transistors M1 and M2. The equalized level by the clock pulse is a medium potential between the supply potential Vcc and ground potential Vss. With this medium potential, the output transistors M1 and M2 do not turn on at the same time. Accordingly, a through-current is controlled not to flow from the supply potential Vcc side to the ground potential Vss side via the output transistors M1 and M2.

In order to control the through-current not to flow through the output transistors M1 and M2 during the equalizing operation, a circuit configuration as shown in FIG. 3 is also known. This circuit forms a latch circuit by NOR gates G1 and G2 to hold the previous data during the equalizing operation. If this circuit is used, the number of gates for data access increases by one stage, thereby disabling high speed access.

A conventional data output control circuit is constructed as described above. Accordingly, when the data is outputted, the capacitor C1 present at the output side load is charged and discharged at high speed. Fluctuation of the supply potential Vcc and ground potential Vss due to this charge/discharge is inevitable. Specifically, as shown in FIG. 1, the capacitor C2 is equivalently connected in parallel with the d.c. power source E. The reactor L2 and resistor R2 are equivalently connected at the supply potential Vcc side of the d.c. power source E, and the reactor L3 and resistor R3 are equivalently connected at the ground potential Vss side. Also in the power supply path of the output circuit section OC, the resistor R4 is equivalently connected at the supply potential Vcc side downstream of the input node N2, and the resistor R5 is equivalently connected at the ground potential Vss side downstream of the input node N3. As a result, if the load side is accessed at high speed, it is inevitable that the levels at the input nodes N2 and N3 of the supply potential Vcc and ground potential Vss will fluctuate. This fluctuation of the potentials Vcc and Vss results in noise within an output signal, which may become a cause of an erroneous operation of the semiconductor circuit. In other words, as shown in FIG. 4, if there is a fluctuation of the supply potential Vcc and ground potential Vss, this operation is equivalent to that noises are relatively introduced within an input signal even if the input signal has actually no noise. For this reason, there is a high possibility of erroneous operations, for example, ATD may operate erroneously to generate the clock pulse $\Phi$.

In the data output control circuit shown in FIG. 1, if noise are generated on the supply potential Vcc and ground potential Vss during the period from time t4 to time t5 as shown in FIGS. 2(a) and 2(i), ATD may operate erroneously to generate the clock pulse having a high level during the period from time t4 to time t5 as indicated by a broken line in FIG. 2(c). In this case, the output impedances of the output transistors M1 and M2 become high because of the clock pulse $\Phi_2$ between the period from time t4 to time t5. Accordingly, the potential at the output node N1 rising up after the access will stop its rise during the period from time t4 to time t5 as indicated by a broken line in FIG. 2(h). When the clock pulse Φ returns to the L level at time t5, the output high impedance state is released and resumes the access of the output. In other words, after time t5, the potential at the node N1 rises as shown in FIG. 2(h). Namely, there is a delay in access. This is a significant problem for a circuit requiring a high speed access.

SUMMARY OF THE INVENTION

The present invention has been made in consideration of the above problems and aims at providing a data output control circuit for a semiconductor storage device free from influences to a data output even if there is erroneously outputted a pulse for equalizing a pair of data lines connected to the control terminals of output buffer switching means, thereby retaining high speed access performance.

During the equalizing operation for the pair of data lines by the equalizing pulse, data line switching means is made turned off. Accordingly, a through current or short circuit current is prevented from flowing through output buffer switching means. The data line switching means is thereafter made turned on so that latch means latches the potentials at the data lines. Namely, latch means latches the data of a selected memory cell. An output is obtained in accordance with the latched data. Assuming that during this output operation the equalizing pulse is erroneously outputted, although data line switching means turns off by this pulse, the data are continuously outputted without interruption with the aid of data latch means. A high speed data read is thereby realized.

DESCRIPTION OF THE PREFERRED EMBODIMENTS

The embodiments of this invention will be described with reference to the accompanying drawings.

Figure 5:
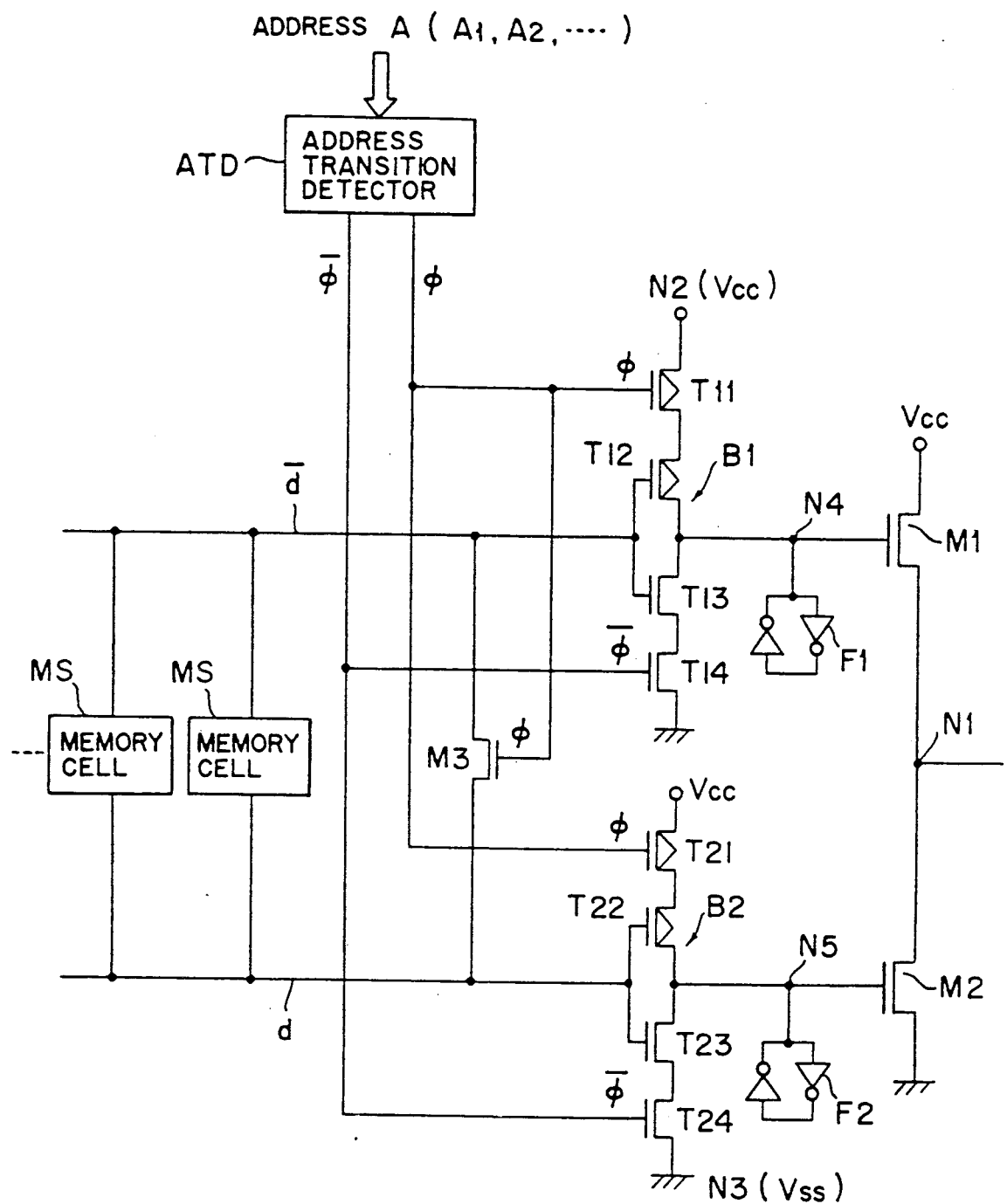
FIG. 5 shows an embodiment of this invention.

FIG. 5 shows an embodiment of this invention.

As shown in FIG. 5, data lines d and $\bar{d}$ are connected to a plurality of memory cells MS, MS,.... Buffers (data line switching means) B1 and B2 are provided in front of the gate of output transistors M1 and M2, respectively. The data lines d and $\bar{d}$ are connected to the buffers as their inputs. The buffer B1 has transistors T11 to T14, and the buffer B2 has transistors T21 to T24. These buffers B1 and B2 are constructed as of a tri-state structure. Namely, the output impedances of the buffers B1 and B2 are made high upon application of the clock pulse Φ of a high level. The data lines d and $\bar{d}$ are equalized by a transistor M3 which is turned on by the clock pulse Φ. To the gates of the output transistors M1 and M2, there are connected latches (latch means) F1 and F2, respectively, which are constructed as of a combination of inverters. When the buffers B1 and B2 take an output high impedance state, the latches F1 and F2 hold the data immediately before the high impedance state and apply the data to the gates of the transistors (output buffer switching means) M1 and M2.

Figure 5A:
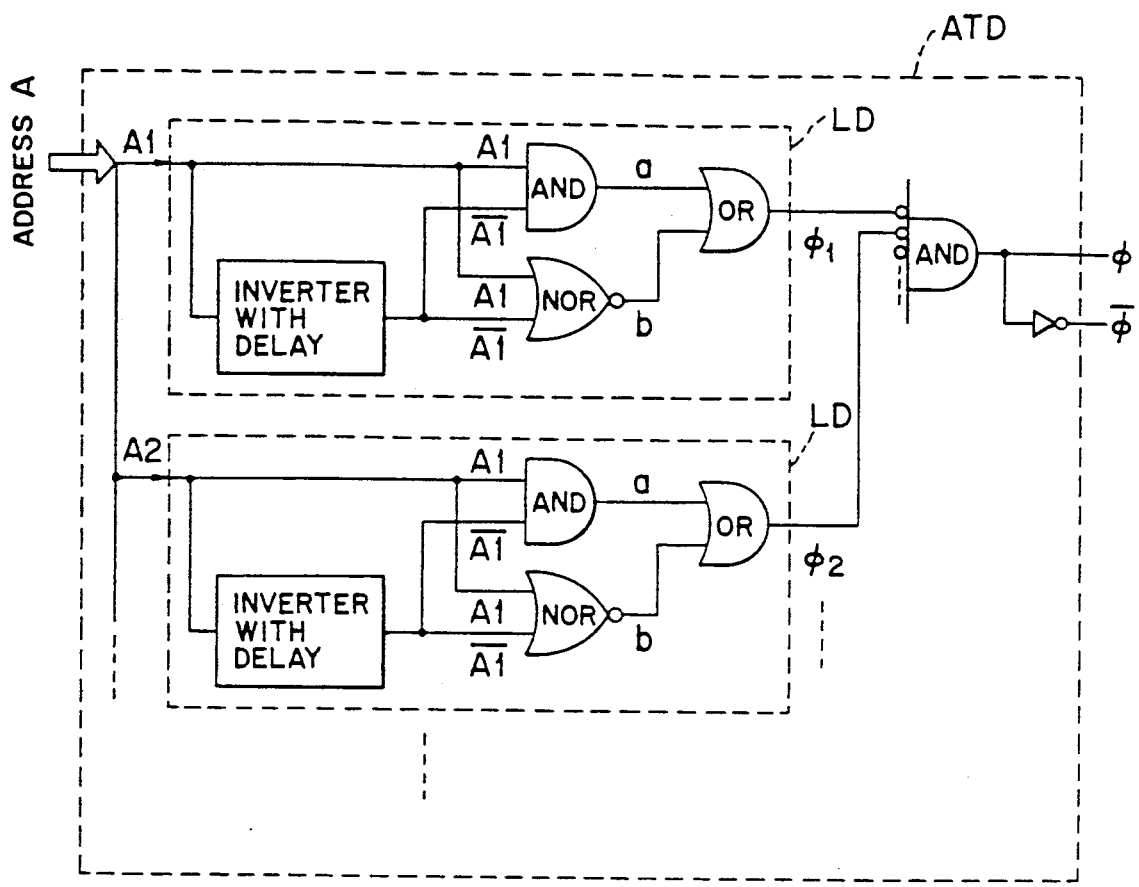
FIG. 5A shows an example of the address transition detector circuit.
Figure 5B:
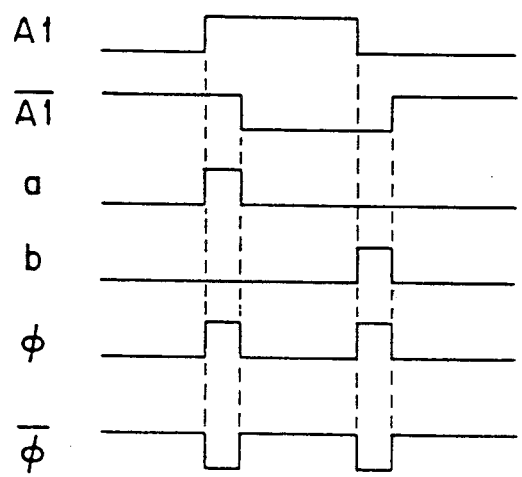
FIG. 5B is a diagram used for explaining the operation of the circuit shown in FIG. 5A.

An address transition detector circuit ATD is constructed, for example, as shown in FIG. 5A. The level changes of respective bits (A1, A2, ...) constituting an address A are detected by corresponding level change detector circuits LD. The inverted values of the obtained outputs $\Phi_1$, $\Phi_2$, ... are inputted to an AND circuit which delivers clock pulses Φ, $\bar{\Phi}$, .... The signal levels at various node of the level change detector circuit are shown in FIG. 5B.

Figure 6:
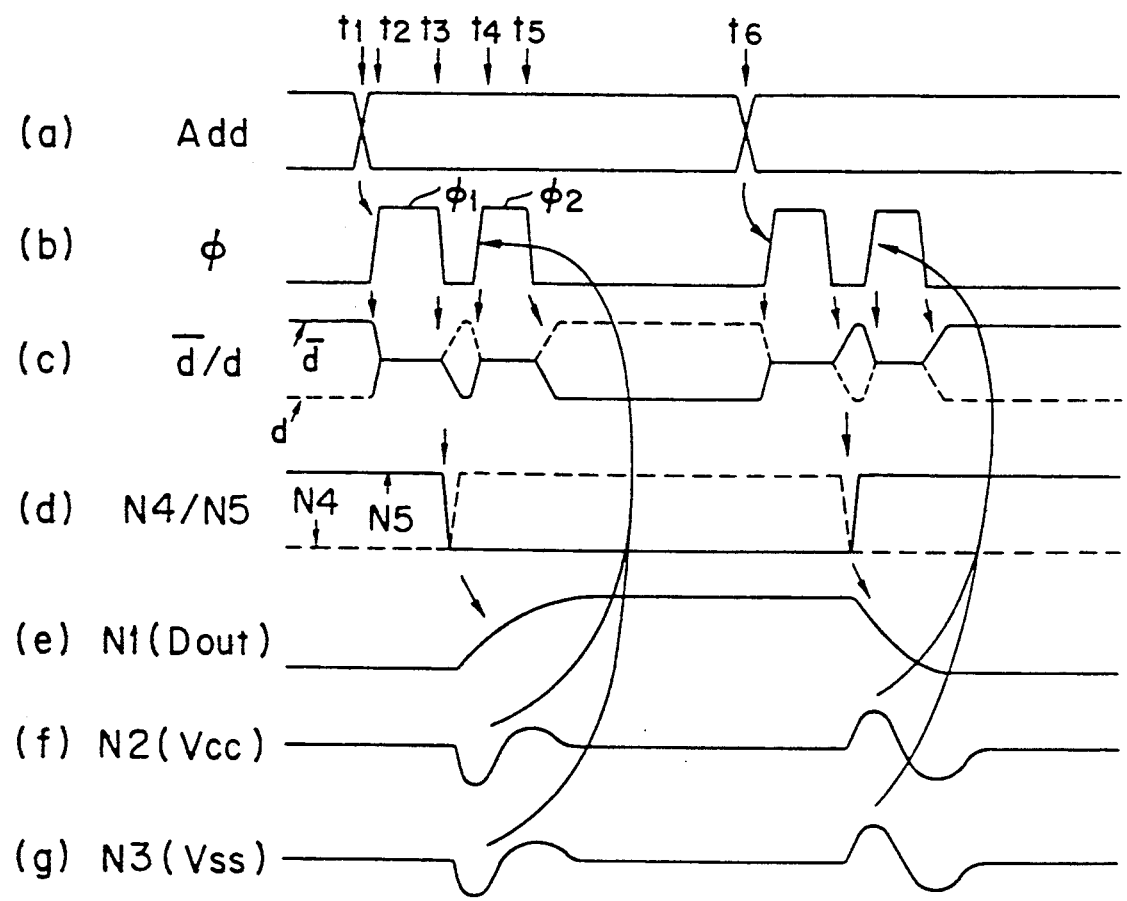
FIG. 6(a-g) is a timing chart used for explaining the operation of the circuit shown in FIG. 5.

The operation of the data output control circuit constructed as above will be described with reference to the timing chart shown in FIG. 6. FIG. 6(a) represents the change of the address signal, FIG. 6(b) represents the clock pulse Φ, FIG. 6(c) represents the state of the data lines d and $\bar{d}$, FIG. 6(d) represents the state at the output nodes N4 and N5 of the buffers B1 and B2, respectively, FIG. 6(e) represents the state at the output node N1 of the output transistors M1 and M2, FIG. 6(f) represents the state of the input node N2 of a supply potential Vcc, and FIG. 6(g) represents the state at the input node N3 of a ground potential Vss.

As shown in FIG. 6(a), an address signal changes at time t1 (t6) so that a clock pulse Φ becomes a clock pulse $\Phi_1$ having a high level during the period from time t2 to time t3 as shown in FIG. 6(b). This clock pulse $\Phi_1$ is inputted to the gate of the transistor M3 to turn it on. Accordingly, the potentials of the data lines d and $\bar{d}$ take medium values during the period from time t2 to time t3 as shown in FIGS. 6(c). The clock pulse $\Phi_1$ is also applied to the buffers B1 and B2 so that the potentials at the output nodes N4 and N5 of the buffers B1 and B2 take a high impedance state during the period from time t2 to time t3. To the output nodes N4 and N5 of the buffers B1 and B2, there are connected the latches F1 and F2. Accordingly, while the buffer B1 and B2 take the high impedance state, the potentials at the output nodes N4 and N5 are held at the previous state by the latches F1 and F2 as shown in FIG. 6(d). When the clock pulse Φ takes a low level at time t3, the transistor M3 turns off. Therefore, the equalizing operation for the data lines d and $\bar{d}$ is released. Therefore, the levels at the data lines d and $\bar{d}$ are established and the high impedance state of the buffers B1 and B2 is released. Accordingly, the state at the output nodes N4 and N5 of the buffers B1 and B2 takes the levels on the data lines d and $\bar{d}$ as shown in FIG. 6(c), so that the data having an output waveform as shown in FIG. 6(e) can be obtained at the output node N1 of the output transistors M1 and M2.

It is assumed that after the above operation, noise is generated on the supply potential Vcc and ground potential Vss during the period from time t4 to time t5 as shown in FIGS. 6(f) and 6(g). In this case, ATD may operate erroneously and the clock pulse Φ becomes the clock pulse Φ₂ having a high level during the period from time t4 to time t5 as shown in FIG. 6(b). In this case, the output impedances of the output transistors M1 and M2 become high because of the clock pulse Φ₂ of the high level. However, the latches F1 and F2 hold the state at the output nodes N4 and N5 immediately before the high impedance state, as shown in FIG. 6(d). Accordingly, as shown in FIG. 6(e), the state of the gate inputs of the output transistors M1 and M2 do not change so that the potential at the output node N1 continuously rises without interruption even under a presence of a false clock pulse Φ₂. When the clock pulse Φ₂ returns to the low level at time t5, the output high impedance state of the buffers B1 and B2 is released. At this time, the levels at the data lines d and d̄ are established after time t5 as shown in FIG. 6(c) as the equalizing operation is released. Therefore, the access continue. Also in this case, as shown in FIG. 6(d), the levels at the output nodes N4 and N5 of the buffers B1 and B2 do not change. Accordingly, the potential at the output node N1 of the output transistors changes continuously without interruption even under a presence of a false clock pulse.

Figure 5C:
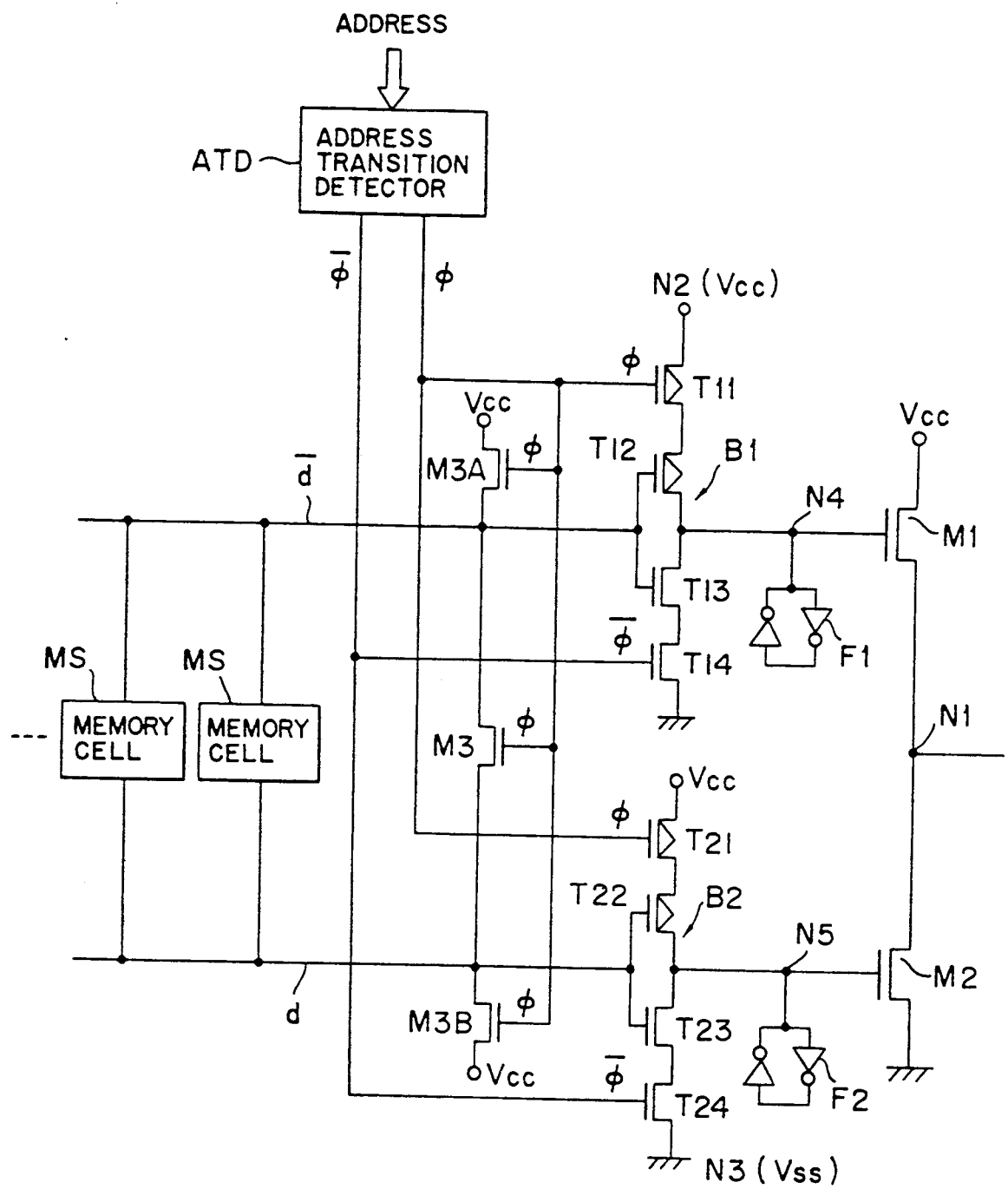
FIG. 5C shows a modified embodiment of FIG. 5.

FIG. 5C shows a modification of the embodiment shown in FIG. 5. The difference of FIG. 5C from FIG. 5 is that transistors M3A and M3B are connected between a complementary pair of data lines d and d̄ and the supply potential Vcc. The clock pulse Φ is applied to the gates of the transistors M3A and M3B so that during the equalizing operation the pair of data lines d and d̄ is set at the supply potential Vcc.

Figure 7:
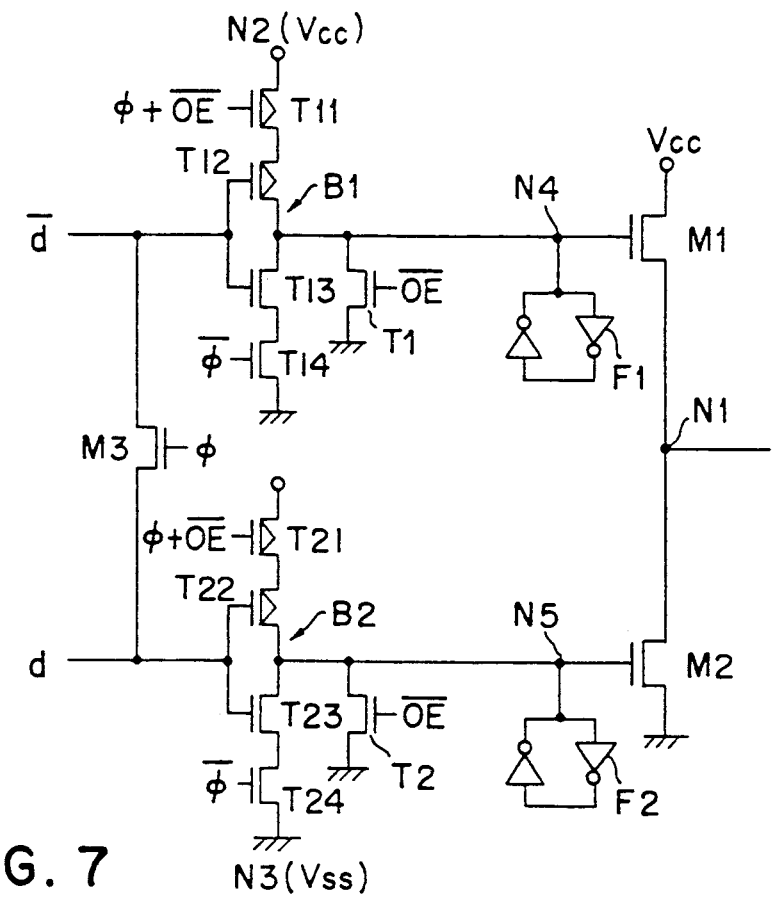
FIGS. 7 to 11 are circuit diagrams showing other embodiments of this invention.

FIG. 7 is a circuit diagram of the data output control circuit according to another embodiment of this invention. This embodiment shows an example of the circuit using an output enable signal $\overline{OE}$. This signal $\overline{OE}$ superposed upon the clock pulse Φ is inputted to the buffers B1 and B2. Transistors T1 and T2 are connected between the output nodes (N4, N5) of the buffers B1 and B2 and the ground (ground potential Vss). The enable signal $\overline{OE}$ is inputted to the gates of the transistors T1 and T2.

In the embodiment shown in FIG. 7, when the enable signal $\overline{OE}$ takes a low level, the circuits shown in FIGS. 7 and 5 operate quite the same manner. In contrast, when the enable signal $\overline{OE}$ takes a high level, the transistors T1 and T2 turn on to make the nodes N4 and N5 a low level. Accordingly, irrespective of the state of other signals, the state at the output node N1 of the output transistors M1 and M2 takes a high level.

Figure 8:
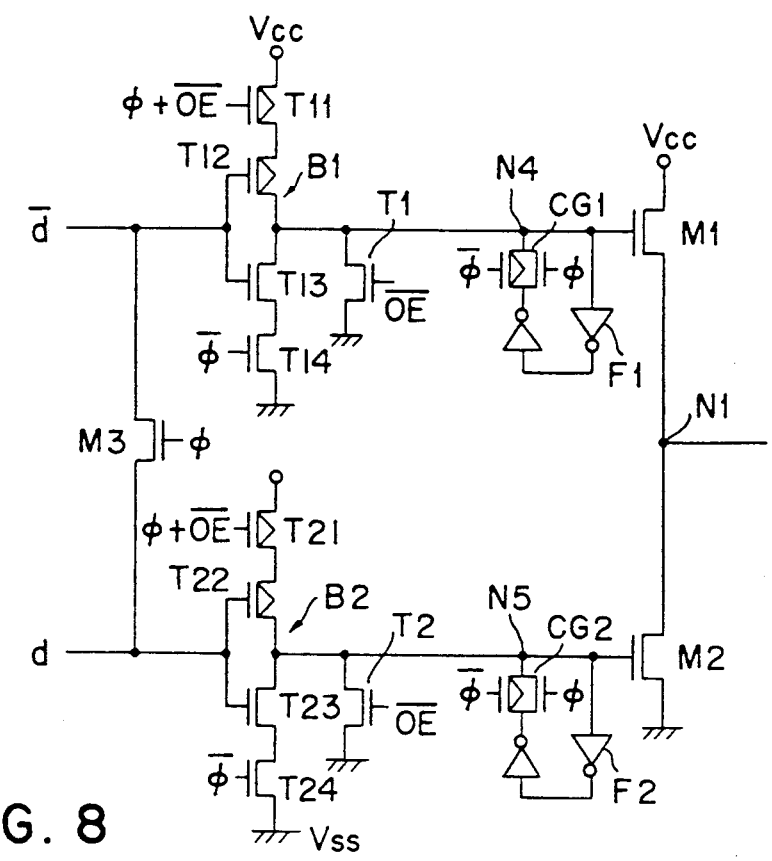

FIG. 8 is a circuit diagram of the data output control circuit according to a further embodiment of this invention. The difference between the circuits shown in FIGS. 8 and 7 is that control gates CG1 and CG2 are provided at the latches F1 and F2. Those gates turn on when the clock pulse Φ takes the high level.

In the embodiment shown in FIG. 8, only when the pulse Φ takes the high level and the buffers B1 and B2 take the high impedance state, the latches F1 and F2 carry out their latch operation.

Figure 1:
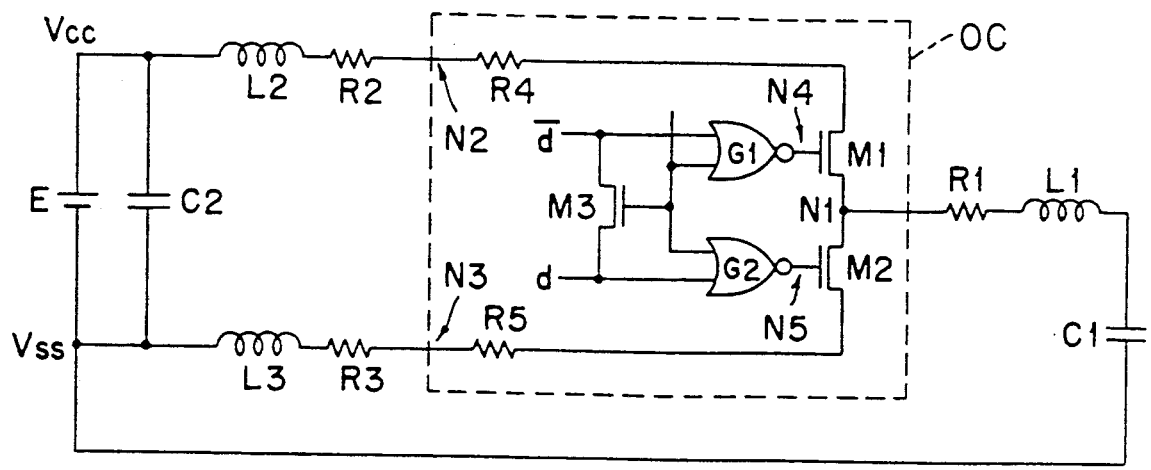
FIG. 1 is a circuit diagram showing a conventional data output control circuit.
Figure 2:
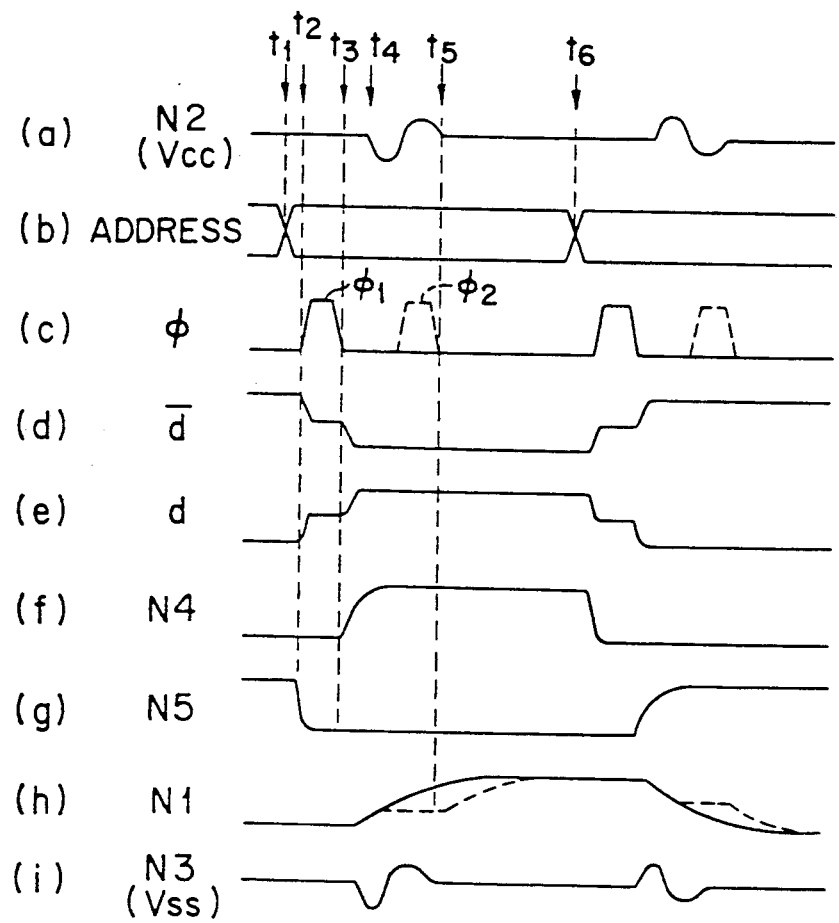
FIG. 2(a-i) is a timing chart used for explaining the operation of the circuit shown in FIG. 1.
Figure 3:
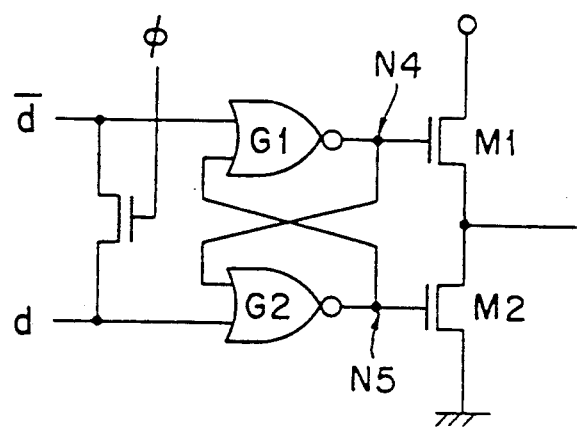
FIG. 3 is a circuit diagram showing another conventional data output control circuit which is intended to prevent a through current or short circuit current from flowing in the output transistors.
Figure 4:
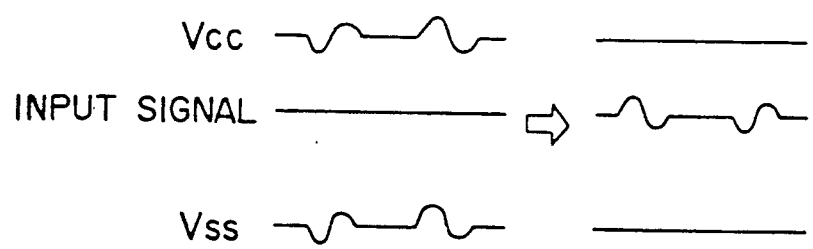
FIG. 4 shows waveforms used for explaining a generation of noises.
Figure 9:
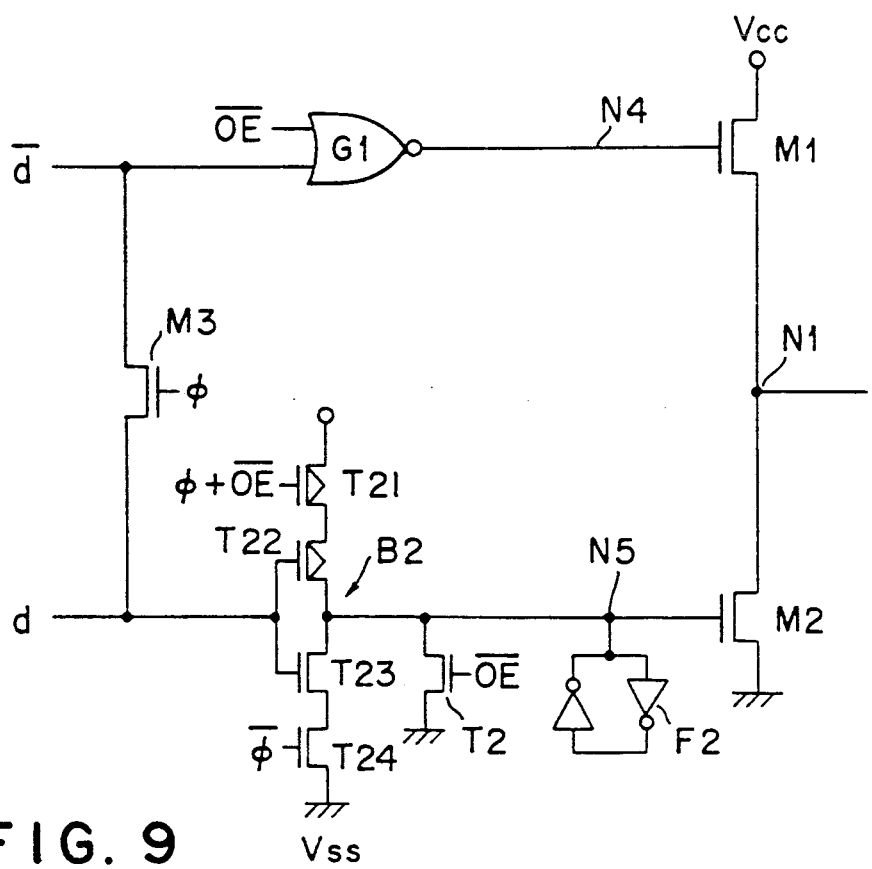

FIG. 9 is a circuit diagram of the data output control circuit according to a still further embodiment of this invention. The difference between the circuits shown in FIGS. 9 and 7 is that the gate of the output transistor M1 is controlled by a NOR gate G1 similar to FIG. 1.

In the embodiment shown in FIG. 9, during an access operation with the data output d having the low level, if noises affect an address input, ATD operates erroneously, and the clock pulse Φ becomes high level, then an access time is delayed. However, during an access operation with the data output d having the high level, the data output can be performed without any delay to be caused by noises. Accordingly, the circuit shown in FIG. 9 is effective for the case where noises are present during an access operation with the data d having the high level.

Figure 10:
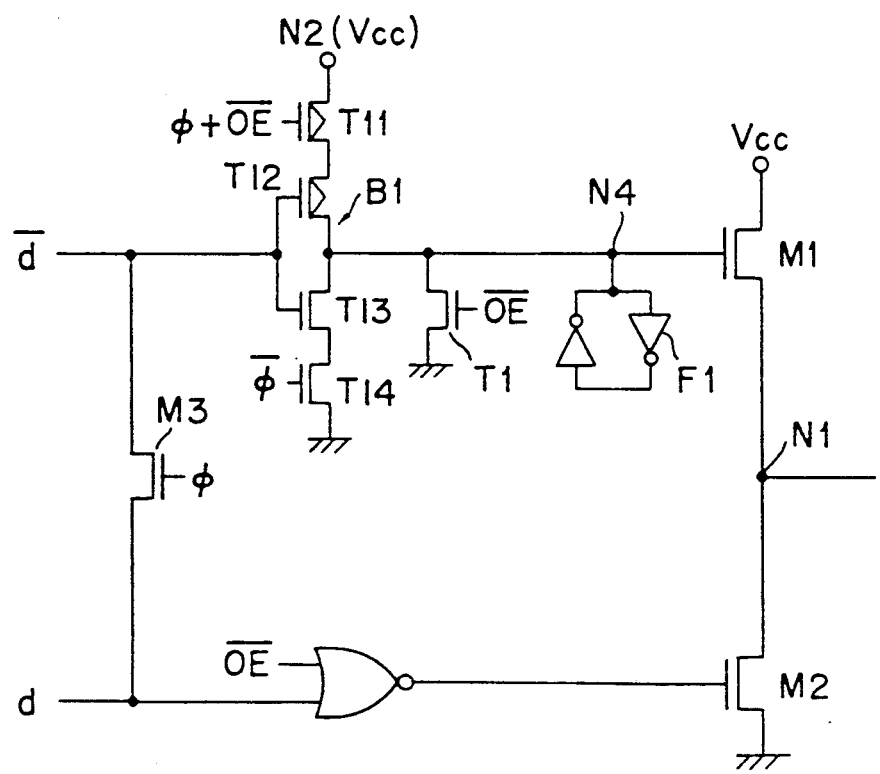

For the case where noises are present during an access operation with the data d having the low level, the circuit such as shown in FIG. 10 may be used.

In the configurations of the above embodiments, a latch for holding data is provided at the input side of the output transistor. Accordingly, even if the front stage buffer erroneously takes the high impedance state during an access operation, the state at the input side of the output transistor does not change, thereby producing no delay in the access of an output and performing high speed access.

In the foregoing description, as the equalizing pulse, clock pulses outputted from ATD have been used. External clock pulses may be used instead.

Figure 11:
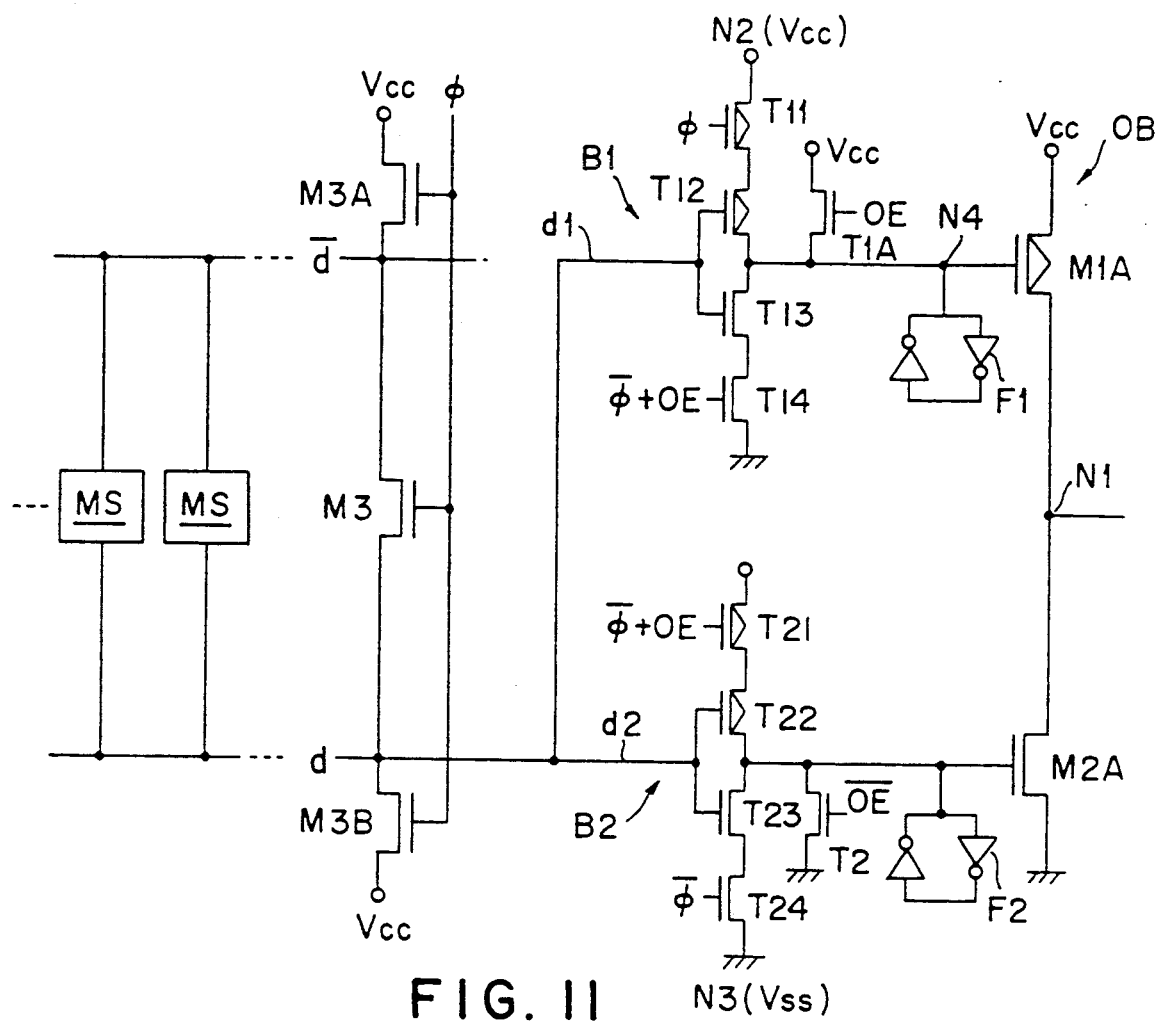

FIG. 11 shows another embodiment of the present invention. In this embodiment, the output stage is of the CMOS type. That is, an output buffer OB is CMOS comprising a p-channel transistor M1A and an n-channel transistor M2A. In FIG. 11, elements similar to those shown in FIGS. 5c and 7 are represented by the same reference numerals. In FIG. 11, one of a pair of data lines d, d̄ is branched into the first and second branch lines d1, d2. These branch lines d1, d2 are connected to control terminals of the transistors M1A, M2A via buffers B1, B2, respectively. A transistor T1A and a data F1 are connected to the first branch line d1, while a transistor T2 and a latch F2 are connected to the second branch line d2.

Figure 12:
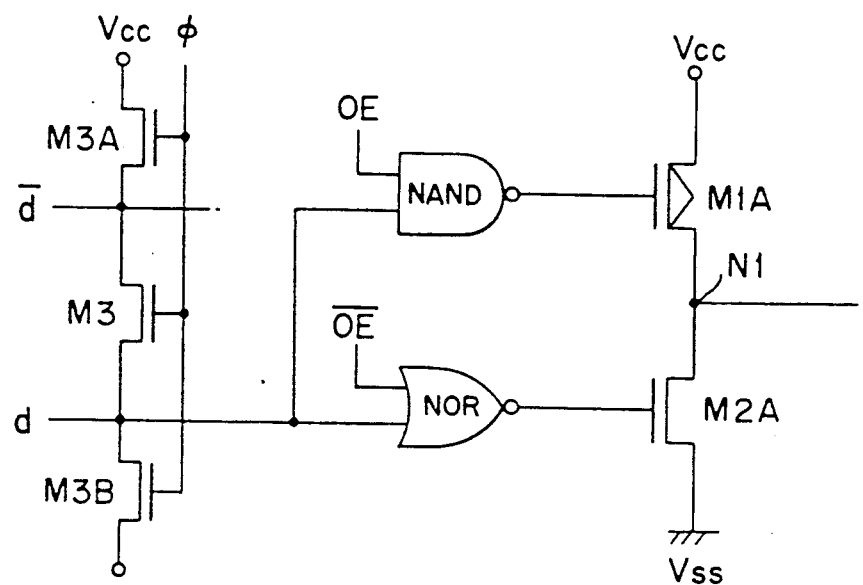
FIG. 12 is circuit diagram showing a conventional data output control circuit corresponding to the circuit of FIG. 11.

FIG. 12 shows background art corresponding to the circuit shown in FIG. 11.

What is claimed is:

1. A data output control circuit for a semiconductor storage device comprising:

equalizing means connected between first and second data lines for setting said first and second data lines at a predetermined equal potential by making said first and second data lines conductive with respect to each other by applying an equalizing pulse to a control terminal, data corresponding to data stored in a memory cell selected according to an address being outputted to said first and second data lines;

output buffer switching means having first and second output switching means connected in series between a power source supply terminal and ground, an interconnection node between said output switching means being a data output terminal, and one and the other of said pair of data lines being connected to one and the other of the control nodes of said first and second output switching means;

data line switching means connected between said equalizing means and said output buffer switching means at least one of said pair of data lines, said data line switching means being turned on and off by said equalizing pulse; and latch means connected between said data line switching means and correspondingly connected ones of said output switching means at said data lines for latching the potentials at said data lines immediately before the turn-off of said data line switching means and applying said latched potentials to the control terminals of said output switching means.

2. A data output control circuit according to claim 1, wherein said data line switching means is provided only between one of said pair of data lines and the correspondingly connected one of said first and second switching means.

3. A data output control circuit according to claim 2, wherein said data line of said pair of data lines without said data line switching means being connected therewith is connected to one input terminal of a logical element for executing an NOR logical operation, the other input terminal of said logical element is applied with an output enable signal, and the output terminal of said logical element is connected to one of said control nodes of said pair of switching means.

4. A data output control circuit according to claim 1, wherein there is provided a data line switch between said data line of said pair of data lines connected with said data line switching means and ground, said data line switch turning off when an output enable signal takes an enable state and turning on when taking a disable state.

5. A data output control circuit according to claim 1, wherein there is provided a latch means switch between said data latch means and correspondingly connected said data lines, said latch means switch being turned on only when said equalizing pulse is outputted.

6. A data output control circuit according to claim 1, wherein said data line switching means is constructed of a serial circuit connected between said power source supply terminal and ground and made of a first p-channel transistor, second p-channel transistor, first n-channel transistor, and second n-channel transistor), one of said pair of data lines is connected to the gates of said second p-channel transistor and said first n-channel transistor, and one of said control nodes of said pair of output switching means is connected to the interconnection node between said second p-channel transistor and said first n-channel transistor.

7. A data output control circuit according to claim 1, wherein said data latch means has a pair of inverters connected reversely in parallel.

8. A data output control circuit according to claim 1, wherein said data line switching means is provided between one and the other of said pair of data lines and the correspondingly connected one and the other of said first and second switching means.

9. A data output control circuit according to claim 1, wherein first and second potential setting switching means are connected to said first and second data lines and said power source supply terminal, and the control terminals of said potential setting switching means are supplied with said equalizing pulse.

10. A data output control circuit according to claim 1, wherein said equalizing pulse is outputted from address transition detector means for detecting a change of said address for selecting said memory cell.

11. A data output control circuit according to claim 1, wherein said first and second switching means are n-channel transistors.

12. A data output control circuit for a semiconductor storage device comprising:

equalizing means connected between first and second data lines for setting said first and second data lines at a predetermined equal potential by making said first and second data lines conductive with respect to each other by applying an equalizing pulse to a control terminal, data corresponding to data stored in a memory cell selected according to an address being outputted to said first and second data lines;

output buffer switching means having first and second output switching means connected in series between a power source supply terminal and ground, an interconnection node between said output switching means being a data output terminal, and first and second branch lines branched from one of side data lines, and being connected to one and the other of the control nodes of said first and second output switching means;

data line switching means connected to said first and second branch lines, said data line switching means being turned on and off by said equalizing pulse; and latch means connected between said data line switching means and correspondingly connected ones of said output switching means at said branch lines for latching the potentials at said branch lines immediately before the turn-off of said data line switching means (B1, B2) and applying said latched potentials to the control terminals of said output switching means.

13. A data output control circuit according to claim 12, wherein said first and second switching means are p-channel and n-channel transistors, respectively, and said output buffer means is CMOS.

14. A data output control circuit according to claim 12, wherein said data line switching means is constructed of a serial circuit connected between said power source supply terminal and ground and made of a first p-channel transistor, second p-channel transistor, first n-channel transistor, and second n-channel transistor, one of said pair of branch lines is connected to the gates of said second p-channel transistor and said first n-channel transistor, and one of said control nodes of said pair of output switching means is connected to the interconnection node between said second p-channel transistor and said first n-channel transistor.

15. A data output control circuit according to claim 12, wherein first and second potential setting switching means are connected to said first and second data lines and said power source supply terminal, and the control terminals of said potential setting switching means are supplied with said equalizing pulse.

* * * * *